United States Patent [19]

Becker

[11] Patent Number: 5,690,735
[45] Date of Patent: Nov. 25, 1997

[54] PROCESS FOR GROWING CRYSTALS

[75] Inventor: Uwe Becker, Stuttgart, Germany

[73] Assignee: Deutsche Forschungsanstalt fuer Luft- und Raumfahrt e.V., Bonn, Germany

[21] Appl. No.: 521,686

[22] Filed: Aug. 31, 1995

[30] Foreign Application Priority Data

Aug. 31, 1994 [DE] Germany .................. 44 30 894.9

[51] Int. Cl.⁶ ............................................. C30B 13/02
[52] U.S. Cl. ........................... 117/35; 117/37; 117/43
[58] Field of Search ........................... 117/2, 35, 37, 117/43, 45, 54, 61

[56] References Cited

U.S. PATENT DOCUMENTS

| | | | |
|---|---|---|---|
| 2,875,108 | 2/1959 | Pfann | 117/43 |
| 4,707,217 | 11/1987 | Akluff | 117/43 |
| 4,737,233 | 4/1988 | Kamgar et al. | 117/43 |

FOREIGN PATENT DOCUMENTS

| | | |
|---|---|---|
| 26 49 201 | 5/1978 | Germany . |
| 41 22 397 | 1/1993 | Germany . |
| 1261292A | 10/1989 | Japan .................. 117/43 |

OTHER PUBLICATIONS

R.S. Feigelson, "Pulling Optical Fibers," *Journal of Crystal Growth*, vol. 79 (1986), pp. 669–680.

*Primary Examiner*—Felisa Garrett
*Attorney, Agent, or Firm*—Barry R. Lipsitz

[57] ABSTRACT

In order to improve a process for growing crystals from a molten zone which is heated and to which a source material is supplied which is melted and deposited in crystalline form on a substrate from the molten zone, such that dimensions of the substrate along an interface between the substrate and the molten zone are dependent to a lesser extent on dimensions of the source material supplied to the molten zone, it is suggested that the molten zone be mechanically stabilized by a wall member which forms a boundary of the molten zone and is essentially immovable relative to the molten zone, a base member which forms a lower boundary of the molten zone and is movable relative to the wall member and a meniscus arranged between the base member and the wall member.

59 Claims, 6 Drawing Sheets

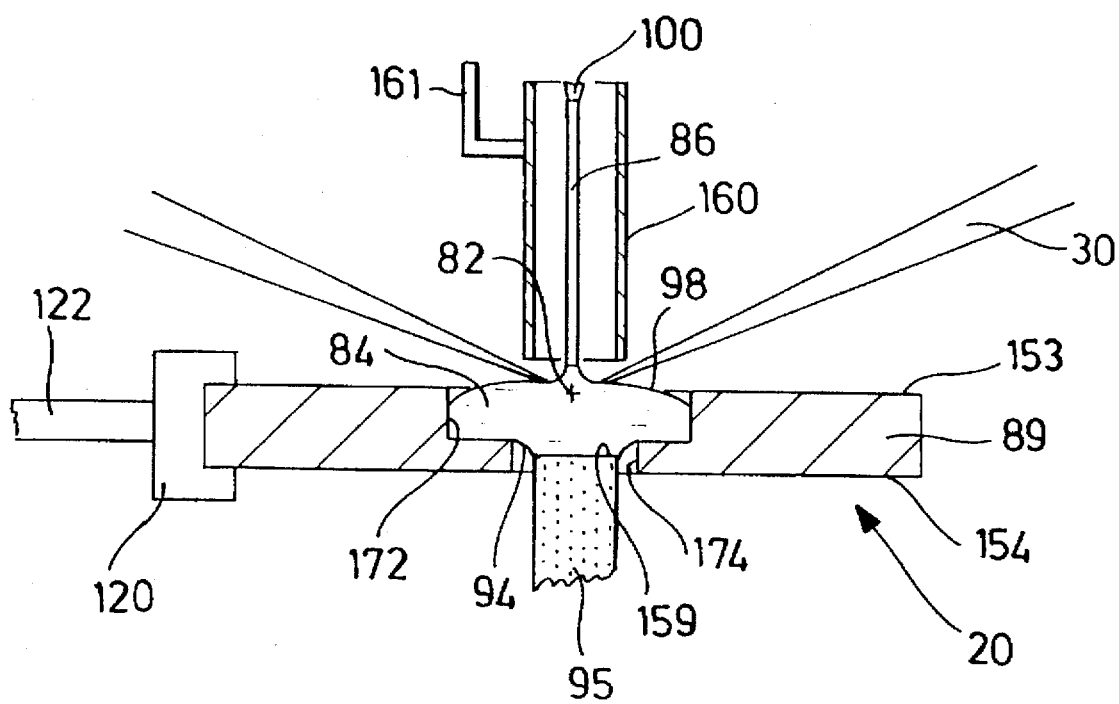

PROCESS FOR GROWING CRYSTALS

BACKGROUND OF THE INVENTION

The present invention relates to a process for growing crystals from a molten zone which is heated and to which a source material is supplied which is melted and deposited in crystalline form on a substrate from the molten zone.

The literature discloses a large number of such processes.

The laser-heated pedestal growth (LHPG) process has proven to be particularly suitable, in particular for producing single-crystal fibers. In the LHPG process, a rod of source material is melted on an upper side with laser radiation to form a molten dome. A seed crystal is brought towards this molten dome from above until it touches the molten dome and a closed molten zone is formed between the seed crystal and the rod of source material. Subsequently, the seed crystal is moved continuously upwards away from the molten zone, whereby source material is deposited in crystalline form at an interface between the seed crystal and the molten zone. When a first layer of new crystalline material has formed on the seed crystal, further source material is deposited in crystalline form at an interface between the crystal which has already grown and the molten zone. The seed crystal, on the one hand, and the crystal which has already grown, on the other hand, therefore serve themselves as substrate at different stages of the process.

In order to make a stationary crystallization process possible, the rod of source material continues to be simultaneously fed from below into the molten zone and successively melted.

The molten zone thereby remains stationary and retains its shape and size. It is stabilized mechanically by a base member (rod of source material) which forms a lower boundary of the molten zone and is movable relative to the molten zone, a top member (seed crystal or crystal already grown) which forms an upper boundary of the molten zone and is movable relative to the molten zone and a meniscus arranged between the base member and the top member.

A serious disadvantage of the LHPG process is to be seen in the fact that the ratio of the diameters of substrate and rod of source material cannot be selected as desired. In order to keep the molten zone stable, the diameter of the substrate must typically be at least one third to a half of the diameter of the base member, depending on the type of material forming the molten zone. When thinner substrates are used, the molten zone become unstable when small disturbances occur which leads to the breakdown of the molten zone and, therefore, to the discontinuance of the crystallization process.

The growth of crystal fibers with diameters in the micrometer range therefore requires the LHPG process to be used several times one after the other and thus the diameter of the resulting crystal fibers reduced gradually to the desired value. This procedure is not only complicated but can also lead to losses in quality since a reduction in the concentration of readily volatile doping agents occurs due to the multiple recrystallization.

The object underlying the invention was, therefore, to improve a process of the generic type such that dimensions of the substrate along an interface between the substrate and the molten zone are dependent to a lesser extent on dimensions of the source material supplied to the molten zone.

SUMMARY OF THE INVENTION

This object is accomplished in a process for growing crystals of the type described at the outset in that the molten zone is mechanically stabilized by a wall member which forms a boundary of the molten zone and is essentially immovable relative to the molten zone, a base member which forms a lower boundary of the molten zone and is movable relative to the wall member and a meniscus arranged between the base member and the wall member.

The advantage of the inventive concept is to be seen in the fact that shape and size of the molten zone are essentially determined by a wall member which is immovable relative to the molten zone and therefore does not serve either as substrate or for the supply of source material, and a base member which is movable relative thereto and therefore relative to the molten zone, as well, and which can serve either as substrate or for the supply of source material.

If the base member serves as substrate, the stability of the molten zone is not dependent on the type of supply of the source material. This dispenses with limiting requirements with respect to the ratios of the dimensions of substrate and source material.

If the base member serves as source material to be supplied to the molten zone, the stability of the molten zone is not dependent on the substrate. In this case, as well, limiting requirements with respect to the ratios of the dimensions of substrate and source material are dispensed with.

It is of advantage for the wall member to form a lateral boundary of the molten zone. The area of the meniscus arranged between the base member and the wall member can, in this case, be kept small and any leakage of the molten zone through a space between the wall member and the base member easily prevented.

The supporting effect of the wall member for the molten zone can be developed particularly well when at least a part of the molten zone is arranged between oppositely located surfaces of the wall member.

It is advantageously provided for the wall member to enclose the molten zone in such a manner that an interface between the wall member and the molten zone separates an additional meniscus which is arranged on a side of the molten zone facing away from the base member from the meniscus arranged between the base member and the wall member. As a result of this measure, the molten zone has two free surfaces (the two menisci) which are mechanically decoupled to a considerable extent so that any disturbance of the one meniscus, for example, due to any jerky movement of the base member has scarcely any effect on the respectively other meniscus.

A continuous deposition of source material on the substrate presupposes a relative movement between the substrate and the molten zone. No details have so far been given concerning the type of relative movement.

In one embodiment of the inventive process, a relative movement is generated between the substrate and the molten zone, during which the substrate is moved away from the molten zone transversely to an interface between the substrate and the molten zone. Such a relative movement allows the growth of crystals with a longitudinal extension of optional length and an essentially constant cross section.

Alternatively or additionally thereto, a relative movement can be generated between the substrate and the molten zone, during which the substrate is moved along an interface between the substrate and the molten zone. Such a relative movement allows, for example, the coating of tape-like substrates.

The relative movement between the substrate and the molten zone along the interface between the substrate and the molten zone advantageously has two degrees of freedom. This makes it possible to also coat those planar substrates which have a greater extension than the molten zone in more than one direction.

It is particularly advantageous for the relative movement between the substrate and the molten zone to have three degrees of freedom. Such a relative movement makes it possible to grow crystals having a complex, three-dimensional geometry.

In an embodiment of the inventive process particularly suitable for the growth of crystals having rotational symmetry, the substrate is advantageously rotated about an axis which is aligned transversely to an interface between the substrate and the molten zone.

As already mentioned, the base member can be used not only as substrate but also as source material to be supplied to the molten zone.

If the base member is used as substrate, this has the advantage that the surface of the substrate can be considerably larger than the interface between the substrate and the molten zone.

If, alternatively thereto, the material of the base member is used as source material, this has the advantage that the cross section of the substrate can be selected to be optionally small.

In this case, a relative movement between the base member and the molten zone is to be provided, during which the base member is moved into the molten zone and partially melted.

If the base member is used as source material, it is favorable for the substrate to be arranged on a side of the molten zone locate opposite to the base member. The crystallization process on the substrate is then only slightly disturbed by the movement of the base member.

An additional, alternative or supplementary possibility of supplying source material to the molten zone consists of introducing source material into the molten zone in powder form. This variation is particularly favorable for the crystallization of larger substance quantities since the expensive production of rods of source material can be dispensed with.

No further details have so far been given concerning the manner in which the molten zone is heated.

It is of advantage for the molten zone to be heated by means of laser radiation. With laser radiation, very high heating powers which are constant in time can be achieved.

It is advantageously provided for the laser radiation to impinge on a side of the molten zone facing away from the base member. Thus, there is no risk of the laser radiation being shadowed by displacement means for generating a relative movement between the base member and the molten zone.

It is particularly advantageous for a laser beam to be generated by an optical projection means and focused onto the molten zone with an annular cross section. The focusing of the laser beam allows such high power densities to be generated that even materials having the highest melting points and melting temperatures of 2,400° C. or more can be melted. The annular cross section of the laser beam generates a corresponding, radially symmetrical temperature profile in the molten zone and this is particularly favorable for the uniform melting of a cylindrical rod of source material which is concentric to the laser beam or for achieving a uniform crystallization on a cylindrical substrate which is concentric to the laser beam.

A completely rotationally symmetrical cross section of the laser beam at a surface of the molten zone and, therefore, a completely rotationally symmetrical temperature profile within the molten zone can be achieved when the laser beam is advantageously focused onto the molten zone free of shadows.

Such a shadow free focusing of the laser beam can be realized in a simple manner in that the laser beam is split in the optical projection means into at least two branch beams which propagate in different directions by means of a beam splitting element which splits a cross-sectional area of the laser beam into individual partial cross-sectional areas which do not overlap one another, the branch beams issuing from the beam splitting element are deflected onto a combining element by means of a deflecting element and the individual branch beams are brought together again by means of the combining element.

No further details have so far been given with respect to the material, from which the wall member is made.

If a all member is used which has essentially the same chemical composition as the source material, this has the advantage that the molten zone cannot be contaminated by foreign substances originating from the wall member and so the growth of high-purity crystals is possible.

Since such a wall member also has the same melting temperature as the source material, an interface between the molten zone and the wall member can be displaced in a simple manner by an alteration in the heating of the molten zone. The size of the molten zone can then be adjusted in an optimum manner to the respective growing process and, where necessary, varied as well during the growth. Three-dimensional hollow bodies having a variable wall thickness can, for example, be grown in this way.

If the molten zone is heated by means of a laser beam focused onto the molten zone, an extension of the molten zone transversely to the laser beam can be adjusted in a particularly simple manner when the wall member is displaced relative to a focal point of the laser beam such that the size of an area, within which the laser beam impinges on the molten zone or the wall member, is varied.

If the size of this area increases, additional material of the wall member is melted and merges into the molten zone which therefore grows at the expense of the wall member. If, on the other hand, the size of this area decreases, material of the molten zone solidifies and merges into the wall member which grows at the expense of the molten zone.

In an alternative embodiment of the inventive process, a wall member consisting of a material which has a higher melting point than the source material is used. This has the advantage that the size and shape of the molten zone can be predetermined by designing the wall member accordingly and are no longer dependent on the heating power above a certain minimum heating power.

It is particularly favorable for the molten zone to be shaped by such a wall member such that an additional meniscus which is arranged on a side of the molten zone facing away from the base member has a considerably greater extension than the meniscus arranged between the base member and the wall member. Crystals which have a considerably larger cross section than the base member can then be drawn from such an additional meniscus. It is, however, of advantage, even for crystals which have a smaller cross section than the base member, for them to be drawn from a broad meniscus since such a broad meniscus is curved to a much smaller extent than a narrow one and this is favorable for the stability of the molten zone and, therefore, the uniformness of the crystal growth.

In all the inventive processes described in the above, it is of advantage for an extension of the source material which is deposited in crystalline form along an interface between the molten zone and the substrate to be measured during the growth of a crystal.

Alternatively or in addition thereto, an extension of the molten zone along an interface between the molten zone and the substrate can also be measured in a region of the molten zone bordering on the substrate during the growth of a crystal.

These measurements allow the progress of the crystallization process to be continuously monitored and for action to be taken in the case of any deviation from predetermined nominal values due to alteration of the relevant parameters, such as, for example, heating power, supply of the source material and substrate speed.

The extension can be measured in a non-contact and, therefore, disturbance-free as well as reliable manner by means of an optical measuring arrangement.

It is favorable to measure an intensity of a bundle of light incident in a detector, which is reduced due to shadowing and/or diffraction at the molten zone or the source material deposited in crystalline form.

An optical measuring arrangement required for such a measurement can be constructed from inexpensive components. In addition, the evaluation of such a measurement is uncomplicated and can therefore be carried out in a short period of time.

It is of advantage for all the measuring processes for the heating of the molten zone and the relative speed between the base member and the molten zone at the beginning of growth to be coordinated with one another such that the molten zone assumes a shape enabling the interface between the molten zone and the substrate to be accessible for measuring the extension.

If, for example, the substrate is arranged on a side of the molten zone facing away from the base member, an additional, upper meniscus extends between the substrate and the wall member and the base member is used as the source material to be supplied to the molten zone, then the molten zone can be lifted by means of a temporary increase in the relative speed between the base member and the molten zone at the beginning of the growth process to above its stationary average value, in such a way that the upper meniscus protrudes beyond the upper wall member so that the wall member does not hinder access to the interface between the molten zone and the substrate.

A measurement of the extension as close to the molten zone and the substrate as possible has the advantage that deviations of the extension from the nominal value can be detected very early.

Advantageously, a relative speed between the substrate and the molten zone is regulated as a function of the measured extension.

In this respect, it is favorable for the relative speed between the substrate and the molten zone to be increased when the measured extension is greater than the nominal value and reduced when the measured extension is smaller than the measured nominal value.

Such a regulation of the relative speed between the substrate and the molten zone represents the most direct and therefore the most inertia-free possibility of compensating for deviations from the nominal value of the extension.

Alternatively or in addition thereto, it is also possible for the supply of source material into the molten zone to be regulated as a function of the measured extension.

In this respect, it is particularly favorable for the supply of source material into the molten zone to be increased when the measured extension is smaller than the nominal value and reduced when the measured extension is greater than the nominal value.

If deviations of the measured extension from the nominal value are compensated by a change in the supply of source material, the relative speed between the substrate and the molten zone can be kept constant, which leads to a better quality growth on the substrate.

Particularly preferred embodiments of the inventive process provide for a temperature gradient which is spatially essentially constant to be generated in the source material deposited in crystalline form. Such a constant temperature gradient minimizes the number of defects incorporated in the grown crystal due to thermal stresses.

The constant temperature gradient is advantageously generated by a reflection of heat issuing from the source material deposited in crystalline form. Such a heat reflection can be realized with simple, maintenance-free components and requires no additional supply of energy.

Alternatively or in addition thereto, it is also possible for the constant temperature gradient to be generated by heating the source material deposited in crystalline form. Such an additional heating of the grown crystal allows the ideal of a constant temperature gradient to be more or less reached with a suitable coordination.

The advantages of the embodiments of the inventive process as described in the above are put into effect in an excellent way when the inventive process is used for growing crystal fibers from a source material which is present in the form of fibers having more than five times the diameter of the crystal fibers.

Such a large reduction in diameter in a single growing step is not possible with the known LHPG process but desired to a considerable degree due to the saving in time and costs and due to the improvement in quality (no decrease in the concentration of readily volatile doping agents).

The inventive object is, furthermore, also accomplished by an apparatus for growing crystals from a molten zone, comprising a heating apparatus for heating the molten zone, a source material suppliable to the molten zone and a substrate, on which material from the molten zone can be deposited in crystalline form, in that the apparatus comprises a wall member which forms a boundary of the molten zone and is essentially immovable relative to the molten zone, a base member which forms a lower boundary of the molten zone and is movable relative to the wall member and a meniscus arranged between the base member and the wall member, the molten zone being mechanically stabilized by these members and the meniscus.

In this respect, it is advantageous for the wall member to form a lateral boundary of the molten zone.

It is of advantage for the effect of the wall member in supporting the molten zone for at least a part of the molten zone to be arranged between oppositely located regions of the surface of the wall member.

It is particularly favorable for the wall member to enclose the molten zone in such a manner that an interface between the wall member and the molten zone separates an additional meniscus, which is arranged on the side of the molten zone facing away from the base member, from the meniscus arranged between the base member and the wall member.

It is also of advantage for the apparatus to comprise a means for generating a relative movement between the substrate and the molten zone, during which the substrate is moved away from the molten zone transversely to an interface between the substrate and the molten zone.

Alternatively or in addition thereto, it can be provided for the apparatus to comprise a means for generating a relative movement between the substrate and the molten zone, during which the substrate is moved along an interface between the substrate and the molten zone.

The apparatus advantageously comprises a means for generating a relative movement between the substrate and the molten zone along the interface between the substrate and the molten zone having two degrees of freedom, which makes it possible to grow arbitrarily structured coatings on planar substrate crystals.

An embodiment of the inventive apparatus which is suitable for growing crystals with a complex three-dimensional geometry comprises a means for generating a relative movement between the substrate and the molten zone having three degrees of freedom.

For the growth of crystals which are rotationally symmetrical, it is particularly favorable for the apparatus to comprise a means for rotating the substrate about an axis which is aligned transversely to an interface between the substrate and the molten zone.

The base member can serve either as substrate or for the supply of source material to the molten zone.

In the latter case, it is favorable for the apparatus to comprise a means for generating a relative movement between the base member and the molten zone, during which the base member is moved into the molten zone transversely to an interface between the base member and the molten zone.

If the base member does not, itself, represent the substrate, it is favorable for the substrate to be arranged on a side of the molten zone located opposite the base member so that the relative movement between the base member and the molten zone interferes as little as possible with the crystallization process at an interface between the substrate and the molten zone.

No details have so far been given concerning the heating apparatus.

The heating apparatus for heating the molten zone advantageously comprises an optical projection means for generating a laser beam focused onto the molten zone with an annular cross section.

It is particularly favorable for the apparatus to comprise an optical projection means for focusing a laser beam onto the molten zone free of shadows.

A particularly simple embodiment of such an optical projection means has a beam splitting element which splits an incident laser beam into at least two branch beams propagating in different directions, this beam splitting element splitting a cross-sectional area of the incident laser beam into individual, partial cross-sectional areas not overlapping one another, a combining element which brings the individual branch beams together to form an exit beam and a deflecting element which deflects the branch beams issuing from the beam splitting element onto the combining element.

In order to prevent foreign substances from reaching the molten zone and soiling it, it can be provided for the wall member to have essentially the same chemical composition as the source material.

In conjunction with an optical projection means for generating a laser beam focused onto the molten zone and a positioning means for altering the position of the wall member relative to a focal point of the focused laser beam, such a wall member allows an extension of the molten zone transversely to the laser beam to be adjusted in a simple manner.

Alternatively thereto, the wall member can also consist of a material which has a higher melting point than the source material. Such a wall member allows the size and shape of the molten zone to be determined essentially independently of the heating apparatus.

It is particularly favorable for such a wall member to have a passage passing through the wall member transversely to an interface between the base member and the molten zone and comprising an opening facing the base member and an opening facing away from the base member, wherein the cross section of the opening facing away from the base member is larger than the cross section of the opening facing the base member. In this case, the molten zone arranged in the passage has on its side facing away from the base member an additional meniscus which has a greater extension than the meniscus arranged between the base member and the wall member.

Crystals can be drawn from this meniscus with a cross section which exceeds that of the base member. Drawing crystals with a smaller diameter than that of the base member results in the advantage that the larger meniscus is curved to a lesser extent and is therefore more stable against disturbances.

Preferred embodiments of the inventive apparatus comprise a measuring arrangement for measuring an extension of the source material deposited in crystalline form along an interface between the substrate and the molten zone and/or a measuring arrangement for measuring an extension of the molten zone along an interface between the substrate and the molten zone in a region of the molten zone bordering on the substrate. The specified measuring arrangements make it possible to continuously monitor the crystallization process. In addition, the data ascertained with the aid of the measuring arrangements can be used for regulating the supply of source material and/or the relative speed between the substrate and the molten zone.

Such a measuring arrangement can, for example, comprise a light source and a light detector.

Furthermore, it is of advantage for the apparatus to comprise a subsequent heating means for generating a temperature gradient in the source material deposited in crystalline form which is spatially essentially constant. Such a constant temperature gradient minimizes the number of defects incorporated in the grown crystal due to thermal stresses.

It is favorable for the subsequent heating means to comprise a heat reflector which needs no additional supply of energy.

Alternatively or in addition thereto, it can also be provided for the subsequent heating means to comprise a heat-generating heating means which allows a very good constancy of the temperature gradient to be achieved with suitable coordination.

Additional features and advantages of the invention are the subject matter of the following description as well as the drawings of several embodiments.

BRIEF DESCRIPTION OF THE DRAWINGS

FIG. 7 shows a section from a partially cutaway side view of a fifth embodiment of an inventive apparatus for growing crystals from a molten zone with a wall member having a high melting point, a substrate arranged above the molten zone and a subsequent heating means.

DETAILED DESCRIPTION OF THE INVENTION

Figure 1:
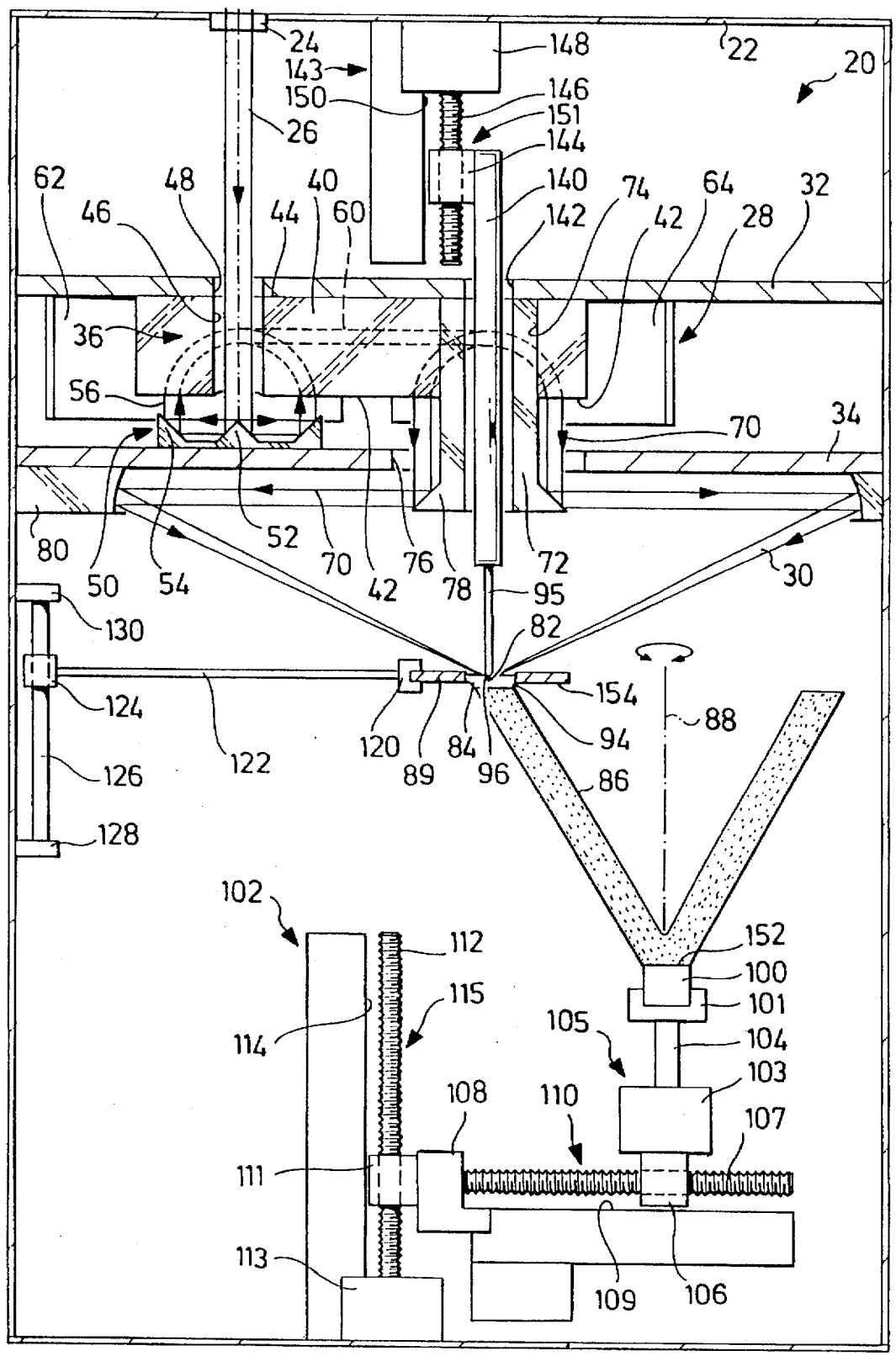
FIG. 1 is a partially cutaway side view of a first embodiment of an inventive apparatus for growing crystals from a molten zone with a base member movable in three dimensions.

Components which are the same as or functionally equivalent to one another are designated with the same reference numerals in all the Figures.

Figure 2:
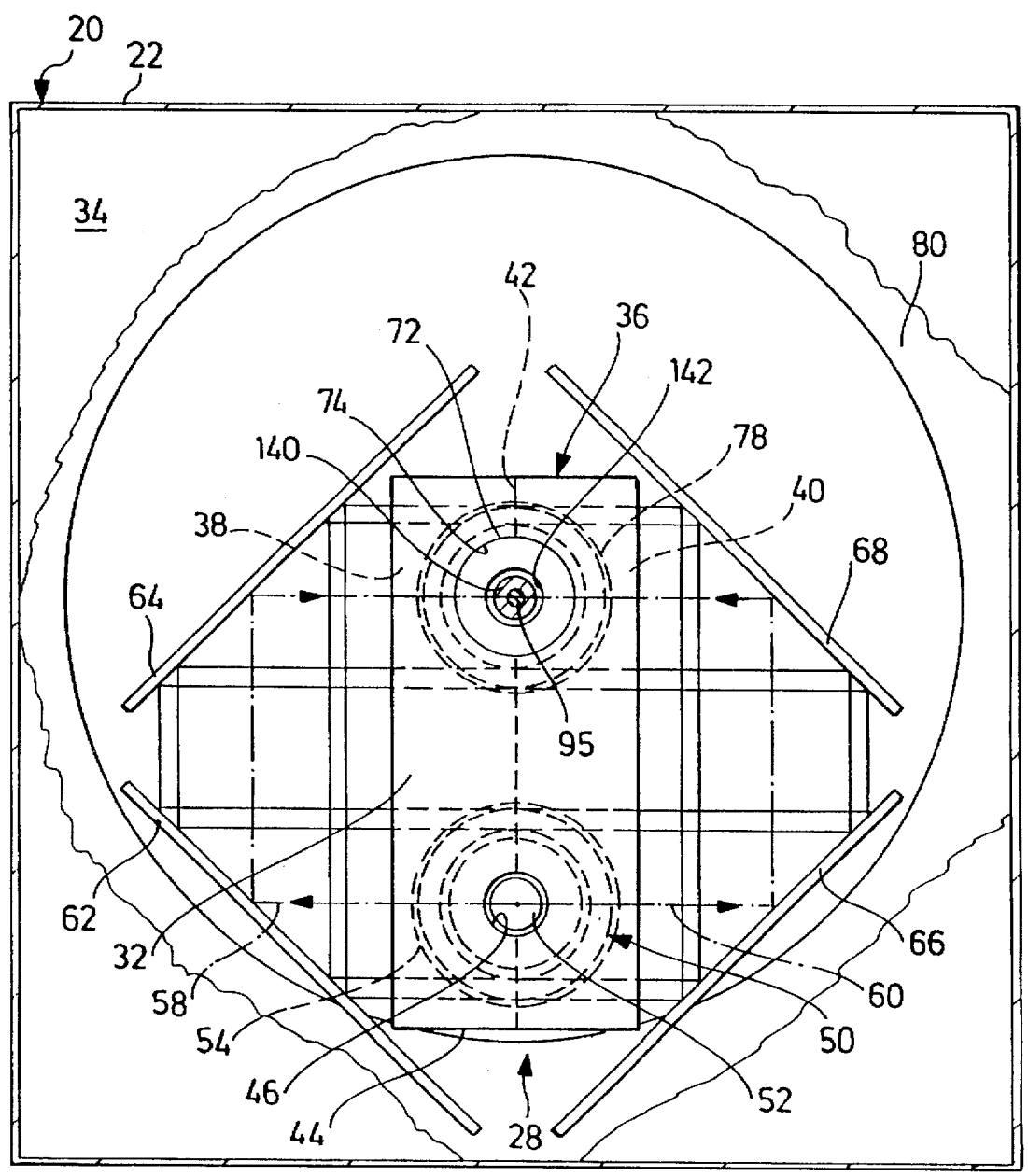
FIG. 2 is a partially cutaway plan view of the optical projection means of the first embodiment of an inventive apparatus from FIG. 1.
Figure 3:
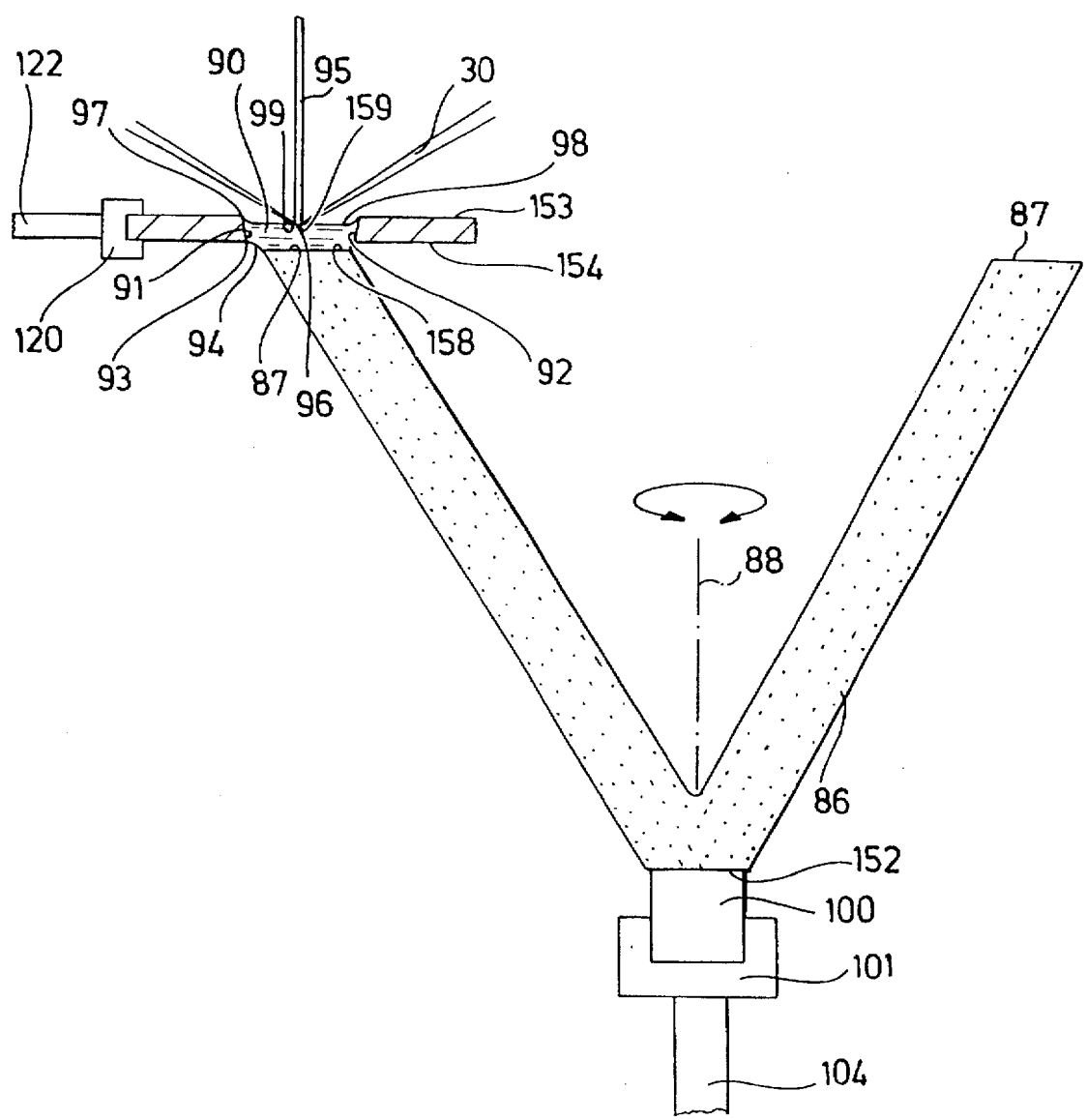
FIG. 3 shows an enlarged section from FIG. 1 in the vicinity of the molten zone.

A first embodiment of an inventive apparatus for growing crystals from a molten zone which is designated as a whole as 20 and illustrated in FIGS. 1 to 3 comprises a parallelepiped housing 22. An inlet window 24 is inserted into an upper end wall of the housing 22 and a laser beam 26 with a round cross section which is generated, for example, by a carbon dioxide laser (not illustrated) passes vertically downwards through this window.

During its further course, the laser beam 26 impinges on an optical projection means which is designated as a whole as 28 and serves to form from the laser beam 26 with a round cross section a convergent laser beam 30 with an annular cross section free of shadows.

The optical projection means 28 comprises a horizontal, upper cover plate 32 and a horizontal, lower cover plate 34 arranged at a distance therebelow. The upper cover plate 32 and the lower cover plate 34 are borne by the inner wall of the housing 22.

An underside of the upper cover plate 32 holds a wedge-shaped mirror 36 with two plane, reflecting wedge surfaces 38, 40 which are aligned at an angle of 90° to one another and have a common edge 42. The edge 42 of the wedge-shaped mirror 36 points downwards while its base 44 abuts on the underside of the upper cover plate 32.

The wedge-shaped mirror 36 has an inlet bore 46 which passes vertically through the wedge-shaped mirror 36, is arranged symmetrical to the edge 42 and aligned with a through inlet hole 48 in the upper cover plate 32.

The incident laser beam 26 passes into the optical projection means 28 through the inlet hole 48 and the inlet bore 46 and then impinges on a refraxicon 50 which is borne by an upper side of the lower cover plate 34.

The refraxicon 50 serves to reshape the originally round beam cross section of the incident laser beam 26 into an essentially annular beam cross section. For this purpose, the refraxicon comprises an outer, conical mirror 52 which is concentric to the inlet bore 46, has an opening angle of 90° and the cone apex of which points towards the inlet bore 46, and an inner, conical mirror 54 which is coaxial to the outer, conical mirror 52 and surrounds the same and the cone-shaped shell of which widens towards the inlet bore 46.

A laser beam 56 directed vertically downwards and having an annular cross section is formed from the incident laser beam 26 which is directed vertically downwards and has a round cross section due to reflection twice, first on the outer conical mirror 52, then on the inner conical mirror 54.

The laser beam 56 directed upwards onto the wedge-shaped mirror 36 is split by reflection at the wedge faces 38 and 40 of the wedge-shaped mirror 36 which are aligned at right angles to one another into two branch beams 58 and 60 which extend in opposite horizontal directions and the respective cross sections of which have the shape of a circular ring halved along a diameter.

Following reflection twice at two plane, vertical mirrors 62 and 64 which are arranged at an underside of the upper cover plate 32 and form an angle of 45° with the edge 42 of the wedge-shaped mirror 36 and an angle of 90° with one another, the first branch beam 58 impinges again on the reflecting wedge surface 38 of the wedge-shaped mirror 36.

The branch beam 60, after reflection twice at two plane, vertical mirrors 66 and 68, which are arranged at an underside of the upper cover plate 32 and form an angle of 45° with the edge 42 of the wedge-shaped mirror 36 and an angle of 90° with one another, likewise impinges again on the reflecting wedge surface 40 of the wedge-shaped mirror 36.

The branch beams 58 and 60 are reflected at the wedge surfaces 38 and 40 and combined again to form an exit beam 70 having an annular cross section and directed vertically downwards.

In this embodiment, the wedge-shaped mirror 36 therefore acts not only as beam splitting element but also as combining element while the plane mirrors 62, 64, 66, 68 form a deflecting element for the branch beams 58, 60.

A hollow-cylindrical sleeve 72 is arranged concentrically to the exit beam 70. This sleeve fits into a vertical through bore 74 of the wedge-shaped mirror 36 and its external diameter is smaller than the internal diameter of the annular cross section of the exit beam 70.

The exit beam 70 and the sleeve 72 together penetrate an outlet hole 76 in the lower cover plate 34, the diameter of which is larger than the external diameter of the annular cross section of the exit beam 70.

At a lower end, the sleeve 72 bears an outer conical mirror 78 which is concentric thereto and has an opening angle of 90°; this mirror tapers upwardly and the exit beam 70 is reflected at the mirror into horizontal directions pointing radially outwards.

Finally, the exit beam 70 reflected at the outer conical mirror 78 impinges on an extra axial parabolic mirror 80 which is arranged at an underside of the lower cover plate 34 and focuses the horizontally incident exit beam 70 onto a focal point 82 which is located on the extended axis of the sleeve 72 beneath the outer conical mirror 78.

This means that the exit beam 70 is shaped to form the convergent laser beam 30 having an annular cross section.

The focal point 82 is located within a molten zone 84 consisting of molten source material. The surroundings of the molten zone 84 are illustrated in an enlarged manner in FIG. 3.

The molten zone 84 is limited downwards by a crystal 86 which forms a base for the molten zone 84 with a section from its upper side 87 and therefore represents a base member. In the embodiment illustrated in FIGS. 1 and 3, the crystal 86 has the shape of a hollow cone standing on its apex and having a vertical axis of symmetry 88.

The molten zone 84 is arranged in a ring opening 90 vertically penetrating a small, annular, horizontally aligned plate 89. A boundary wall 91 of the ring opening 90 forms a side wall of the molten zone 84 which surrounds the molten zone 84 so that the small plate 89 represents a wall member.

The material of the small plate 89 has, in this embodiment, essentially the same chemical composition as the material of the molten zone 84 and, therefore, the same melting temperature. An interface 92 between the molten zone 84 and the small plate 89 therefore extends along the melting point isotherm of the source material.

A concave, lower meniscus 94 of the molten zone 84 extends between the upper side 87 of the crystal 86 and a lower edge 93 of the ring opening 90.

A cylindrical, vertically aligned rod of source material 95 borders on an upper side of the molten zone 84.

An upper meniscus 98 extends between an edge of a lower side 96 of the rod of source material 95 and an upper edge 97 of the ring opening 90 of the small plate 89. In the embodiment illustrated in FIGS. 1 and 3, this meniscus is concave overall but can, in certain circumstances, also be convex in sections, as will be explained later.

The convergent laser beam 30 having an annular cross section impinges on this upper meniscus 98 within an essentially annular impact area 99.

The internal diameter of the impact area 99 is greater than the diameter of the rod of source material 95 so that the laser beam 30 is not shadowed by the rod of source material 95.

The flattened tip of the hollow cone-shaped crystal 86 is borne by a cylindrical seed crystal 100 which is concentric to the axis of symmetry 88 and clamped in a bowl-like crystal holder 101.

A first displacement means 102 is provided for generating a relative movement between the crystal (base member) 86 and the molten zone 84 and, in the embodiment illustrated in FIG. 1, this facilitates a vertical and a horizontal linear displacement of the crystal holder 101 as well as a rotation of the crystal holder 101 about the axis of symmetry 88 of the crystal 86.

The first displacement means 102 comprises a first rotary drive 103 with a drive shaft 104 which bears the crystal holder 101 and the axis of which coincides with the axis of symmetry 88 of the crystal 86.

The first rotary drive 103 therefore forms, together with the drive shaft 104, a crystal holder rotating means 105 which enables the crystal 86 to rotate about the axis of symmetry 88.

A first spindle nut 106 is arranged on a housing wall of the first rotary drive 103 and is seated on a first spindle 107 of a second rotary drive 108. The first spindle 107 is aligned parallel to that horizontal straight line which extends through the focal point 82 and intersects the axis of symmetry 88 of the crystal 86.

The first spindle nut 106 is guided on a first guide means 109 which is borne by a housing of the second rotary drive 108 and is aligned parallel to the first spindle 107.

The second rotary drive 108 enables the crystal holder 101 and, therefore, the crystal 86 to be displaced linearly horizontal since a rotary movement of the first spindle 107 caused by the second rotary drive 108 is converted into a linear movement of the first spindle nut 106, which is prevented from rotating by the first guide means 109, along the first spindle 107.

The second rotary drive 108 therefore forms, together with the first spindle 107, the first spindle nut 106 and the first guide means 109, a horizontal-linear displacement means 110.

A second spindle nut 111 is arranged on a housing wall of the second rotary drive 108 and is seated on a second spindle 112 of a third rotary drive 113. The second spindle 112 is vertically aligned.

The second spindle nut 111 is guided on a second guide means 114 which is borne by a housing of the third rotary drive 113 and aligned parallel to the second spindle 112.

The housing of the third rotary drive 113 is borne by an inner wall of the housing 22.

The third rotary drive 113 enables the crystal holder 101 and, therefore, the crystal 86 to be moved upwards or downwards since a rotary movement of the second spindle 112 caused by the third rotary drive 113 is converted into a linear movement of the second spindle nut 111, which is prevented from rotating by the second guide means 114, along the second spindle 112.

The third rotary drive 113 therefore forms, together with the second spindle 112, the second spindle nut 111 and the second guide means 114, a vertical-linear displacement means 115.

The first displacement means 102, comprising the vertical-linear displacement means 115, the horizontal-linear displacement means 110 and the crystal holder rotating means 105, therefore serves to generate a relative movement between the crystal (base member) 86 and the molten zone 84 with three degrees of freedom which can be utilized for growing rotationally symmetrical crystals having a complex, three-dimensional crystal geometry.

For growing non-rotationally symmetrical crystals with a complex, three-dimensional crystal geometry, a second horizontal-linear displacement means is provided alternatively or in addition to the crystal holder rotating means 105 and the spindle of this displacement means is aligned horizontally and transversely to the first spindle 107 of the horizontal-linear displacement means 110.

An external section of the small plate 89 surrounding the molten zone 84 is clamped in a plate holder 120 which is connected to a holder 124 via a holding rod 122, this holder being guided on a vertical linear guide means, for example a positioning bar 126. The positioning bar 126 is mounted in two bearing bushes 128, 130 which are, again, held by an inner wall of the housing 22.

The rod of source material 95 is clamped in a, for example, tubular rod holder 140 which is arranged concentrically to the sleeve 72. The rod holder 140 has an external diameter which is smaller than the internal diameter of the sleeve 72 and passes through the sleeve 72 as well as a through hole 142 in the upper cover plate 32.

A second displacement means 143 is provided for generating a relative movement between the rod of source material 95 and the molten zone 84 and allows a vertical linear displacement of the rod holder 140.

The second displacement means 143 has a third spindle nut 144 which holds the rod holder 140 at its upper end and is seated on a vertically aligned third spindle 146 of a fourth rotary drive 148. The third spindle nut 144 is guided on a third guide means 150 which is borne by a housing wall of the fourth rotary drive 148 and aligned parallel to the third spindle 146.

The housing of the fourth rotary drive 148 is held by an inner wall of the housing 22.

The fourth rotary drive 148 enables the rod holder 140 and, therefore, the rod of source material 95 to be moved upwards or downwards since a rotary movement of the third spindle 146 caused by the fourth rotary drive 148 is converted into a linear movement of the third spindle nut 144, which is prevented from rotating by the third guide means 150, along the third spindle 146.

The fourth rotary drive 148 therefore forms, together with the third spindle 146, the third spindle nut 144 and the third guide means 150, a vertical-linear displacement means 151 for the rod holder 140.

At the beginning of the inventive process for growing crystals from a molten zone, the crystal 86 is not yet present, and an upper end face 152 of the seed crystal 88 represents a free surface.

With the aid of the displacement means 102, the crystal holder 101 with the seed crystal 100 is displaced horizontally and vertically until the upper end face 152 of the seed crystal 100 is located slightly below the small plate 89, and the extension of the axis of the seed crystal 100 extends through the focal point 82.

At the beginning of the process, the ring opening 90 of the small plate 89, in which the focal point 82 is located, is either empty or filled with solidified source material.

If solidified source material is present in the vicinity of the focal point 82, this melts once the laser is switched on and forms the molten zone 84 in the ring opening 90.

If, at the beginning of the process, no solidified source material is located in the vicinity of the focal point 82, the rod holder 140 with the rod of source material 95 clamped therein is moved downwards with the aid of the second displacement means 143 so that a lower end of the rod of source material 95 reaches the focal point 82, is then melted and forms the molten zone 84.

Since the small plate 89 has essentially the same composition as the molten zone 84, extension and shape of the molten zone 84 are determined by the laser power supplied and the position of the small plate 89 relative to the focal point 82 of the convergent laser beam 30.

When the laser power supplied is increased, the volume of the molten zone 84 increases and the interface 92 between the molten zone 84 and the small plate 89 migrates away from the focal point 82 while the ring opening 90 widens.

When the laser power supplied is reduced, the volume of the molten zone 84 decreases and the interface 92 between the molten zone 84 and the small plate 89 migrates towards the focal point 82 while the ring opening 90 narrows.

The position of the small plate 89 relative to the focal point 82 can result from a displacement of the holder 24 along the positioning rod 126, whereby the small plate 89 is displaced upwards or downwards and therefore an upper side 153 of the small plate 89 is displaced away from or towards the (stationary) focal point 82 in a vertical direction.

If the upper side 153 and, with it, the upper meniscus 98 is displaced away from the focal point 82, the external diameter of the annular impact area 99 of the convergent laser beam 30 increases.

This leads to an increase in a horizontal extension of the molten zone 84. The interface 92 between the molten zone 84 and the small plate 89 migrates in horizontal direction away from the focal point 82, namely at the upper side 153 of the small plate 89 to a greater extent than at its underside 154 so that the interface 92 is tilted relative to the vertical.

If, on the other hand, the upper side 153 and, with it, the upper meniscus 98 is displaced towards the focal point, the external diameter of the annular impact area 99 decreases.

This leads to a decrease in the horizontal extension of the molten zone 84. The interface 92 between the molten zone 84 and the small plate 89 migrates in horizontal direction towards the focal point 82, whereby the tilting of the interface 92 relative to the vertical is reduced.

First of all, the seed crystal 100 forms a lower boundary of the molten zone 84 and represents a base member. The diameter of the molten zone 84 at the underside 154 of the small plate 89 is selected to be larger than the diameter of the seed crystal 100. The lower meniscus 94 forming between the upper end face 152 of the seed crystal 100 and the lower edge 93 of the ring opening 90 of the small plate 89 prevents any discharge of the molten source material out of the molten zone 84.

In order to grow the crystal 86, the seed crystal 100 is now drawn downwards out of the molten zone 84 with the aid of the vertical-linear displacement means 115. The molten source material located at an interface between the molten zone 84 and the seed crystal 100 thereby cools and is deposited on the upper end face 152 of the seed crystal 100 in crystalline form.

The layer of the crystal 86 thus formed forms, on the other hand, an interface 158 between the molten zone 84 and the crystal 86 and serves as substrate for the depositing of additional source material from the molten zone 84.

In order to generate a crystal 86 in the shape of the hollow cone shown in FIGS. 1 and 3, a horizontal translational movement is superimposed over the vertical downward movement of the crystal holder 101 with the aid of the horizontal-linear displacement means 110 and a rotary movement about a vertical rotary axis with the aid of the crystal holder rotating means 105. The crystallization of the cone-shaped shell therefore results along a helical path.

In order to ensure a stationary crystallization process, the rod of source material 95 is continuously fed into the molten zone 84 with the aid of the second displacement means 143. The subsequent supply rate of the rod of source material 95 is thereby coordinated with the feed rate of the crystal 86 such that the quantity of source material melted per unit of time at an interface 159 between the molten zone 84 and the rod of source material 95 corresponds to that lost to the molten zone 84 due to crystallization at the interface 158 between the molten zone 84 and the crystal 86.

Under these conditions, the molten zone 84 retains its shape and extension during the continuous growth process. It is mechanically stabilized by the small annular plate (the wall member) 89, the crystal (base member) 86 and by the lower meniscus 94 arranged between the small plate 89 and the crystal 86.

The shape of the lower meniscus 94 results by minimizing the sum resulting from the interface energies of the interface 92 between the molten zone 84 and the small plate 89 and the interface 158 between the molten zone 84 and the crystal 86, the surface energy of the lower meniscus 94 as well as the gravitational energy of the molten zone 84.

Instead of in the form of a solid rod of source material 95, the source material can also be supplied to the molten zone 84 in the form of a powder over the upper meniscus 98. This solution is particularly favorable for the crystallization of larger quantities of substance since the production of a rod of source material 95 which is possibly expensive is dispensed with.

Since the small plate 89 serving as wall member has the same chemical composition as the molten zone 84, the melt cannot be contaminated with foreign material and so the growth of high-purity crystals is possible.

The horizontal, spatial resolution of the crystalline structures which can be generated is determined by the diameter of the molten zone 84 at the interface 158 between the molten zone 84 and the crystal 86. The strong focusability of the laser radiation allows this diameter and, with it, the horizontal spatial resolution of the grown crystalline structure to be reduced as far as approximately 1 μm.

Moreover, the high power density of the laser radiation in the region of the focal point 82 allows substances having very high melting points, such as, for example, sapphire, to also be melted.

Figure 4:
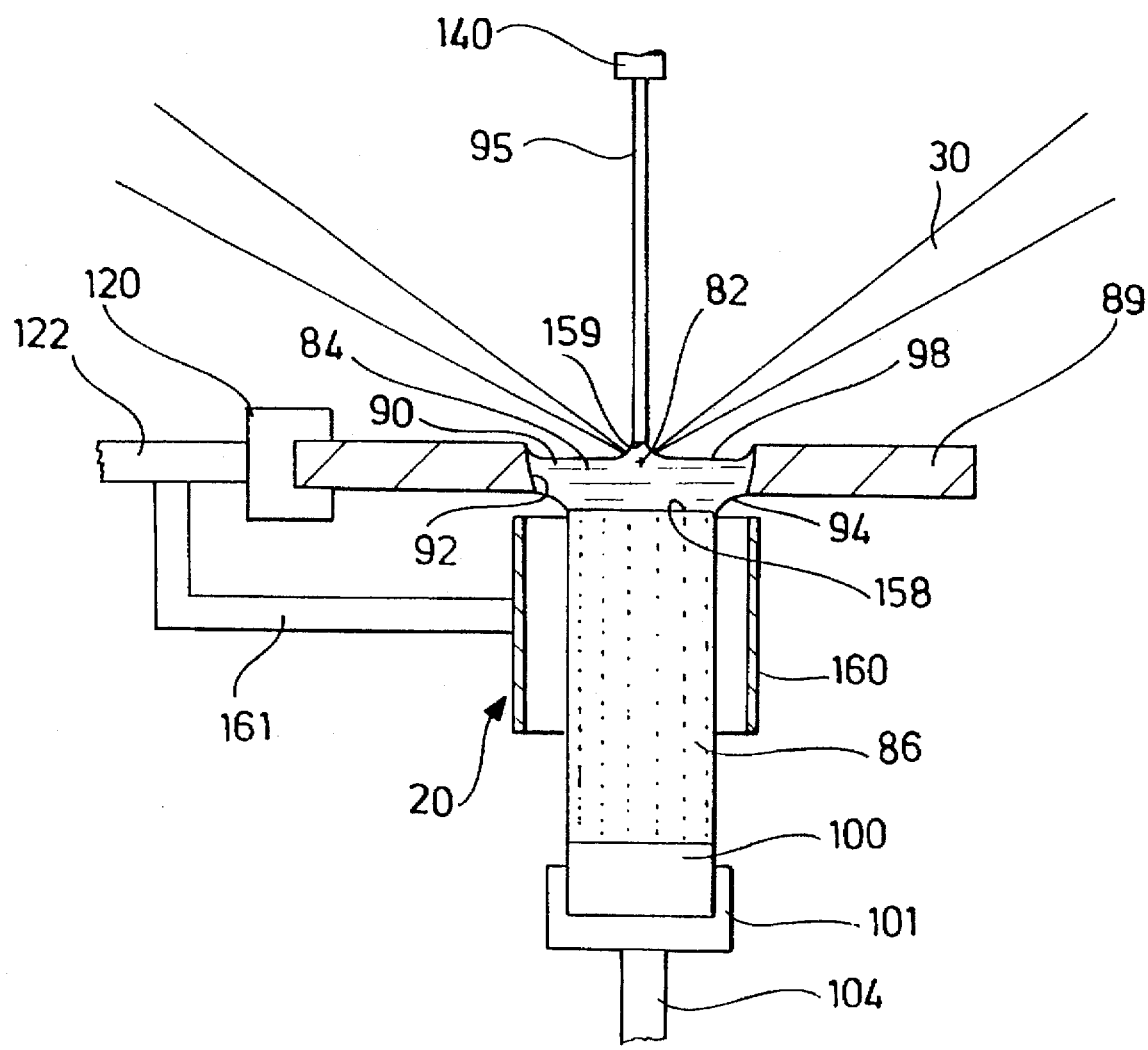
FIG. 4 shows a section from a partially cutaway side view of a second embodiment of an inventive apparatus for growing crystals from a molten zone with a subsequent heating means and one-dimensional mobility of the base member at right angles to the interface between the base member and the molten zone.

A second embodiment of an inventive apparatus 20 for growing crystals from a molten zone, a detail of which is illustrated in FIG. 4, differs from the first embodiment described above in that an additional subsequent heating means 160 is provided in the form of a small ceramic tube made of sapphire which is held by the holding rod 122 with the aid of a holder 161, is arranged beneath the small plate 89 coaxially to the ring opening 90, surrounding the crystal 86, and reflects the heat radiated by the crystal 86 back to the crystal 86.

Due to the subsequent heating means 160 it is possible for a temperature gradient along the crystal 86, vertically to the interface 158 between the crystal 86 and the molten zone 84, to be as spatially constant as possible. A constant temperature gradient minimizes the number of defects incorporated in the crystal 86 due to thermal stresses.

Without a subsequent heating means 160, the temperature along the crystal 86 would decrease to a stronger degree than linearly with the distance from the interface 158.

Instead of a small ceramic tube made of sapphire, a small tube made of another material which has a high melting point and is a good heat reflector can also be used as subsequent heating means 160.

Instead of such a passive subsequent heating means 160 or in addition thereto, an active subsequent heating means, for example a resistance or inductive heating, can also be arranged around the crystal 86 in order to obtain as constant a temperature gradient as possible.

Figure 5:
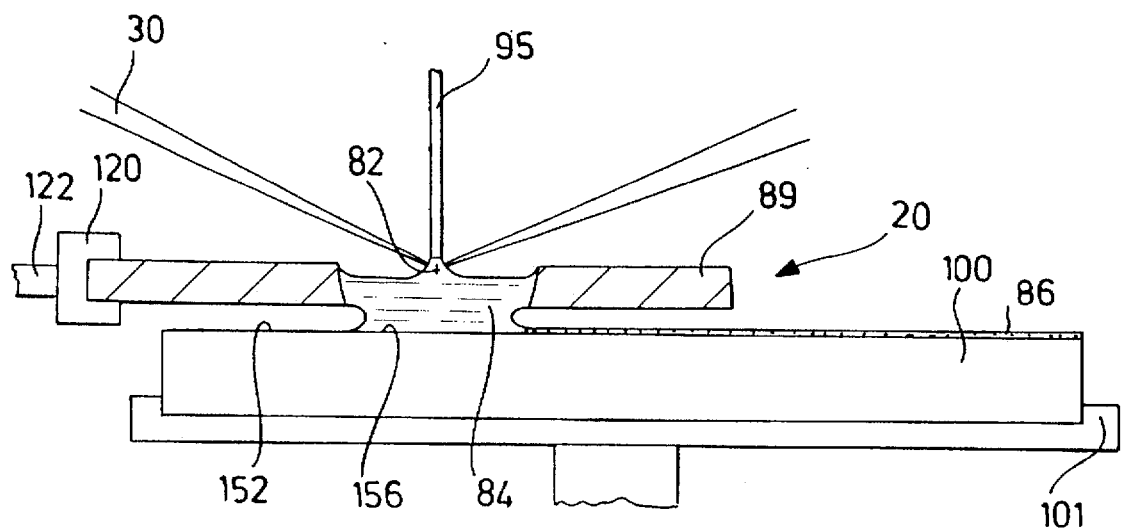
FIG. 5 shows a section from a partially cutaway side view of a third embodiment of an inventive apparatus for growing crystals from a molten zone with two-dimensional mobility of the base member along the interface between the base member and the molten zone.

A third embodiment of the inventive apparatus 20 for growing crystals from a molten zone, a detail of which is illustrated in FIG. 5, is particularly suitable for coating planar substrate crystals 100.

For this purpose, the planar substrate crystal 100 is clamped into a crystal holder 101 adapted to its geometry.

The interface 156 between the molten zone and the substrate crystal represents only a small section from the entire upper side 152 of the substrate crystal 100. A crystalline coating of the entire upper side 152 is attained by displacing the substrate crystal 100 horizontally beneath the molten zone 84, whereby the molten source material from the molten zone 84 is crystallized at an edge of the interface 156 between the molten zone 84 and the substrate crystal 100 which faces away from the respective direction of movement.

The necessary, horizontal movements can be generated for a round substrate crystal 100 with the aid of the arrangement illustrated in FIG. 1 having a crystal holder rotating means 105 and a horizontal-linear displacement means 110.

For coating non-rotationally symmetrical substrate crystals 100, it is, on the other hand, necessary to provide a second horizontal-linear displacement means alternatively or in addition to the crystal holder rotating means 105 and the spindle of this displacement means is aligned horizontally and transversely to the first spindle 107 of the horizontal-linear displacement means 110. In this way, two horizontal translational degrees of freedom are available for the movement of the substrate crystal 100.

A multiple coating or the generation of thick coatings is possible when a vertical translational movement is superimposed over the horizontal movement of the substrate crystal 100 with the aid of the vertical-linear displacement means 111.

Not only homoepitaxial but also heteroepitaxial layers can be deposited when using substrate crystals 100 having a suitable crystallographic orientation.

Figure 6:
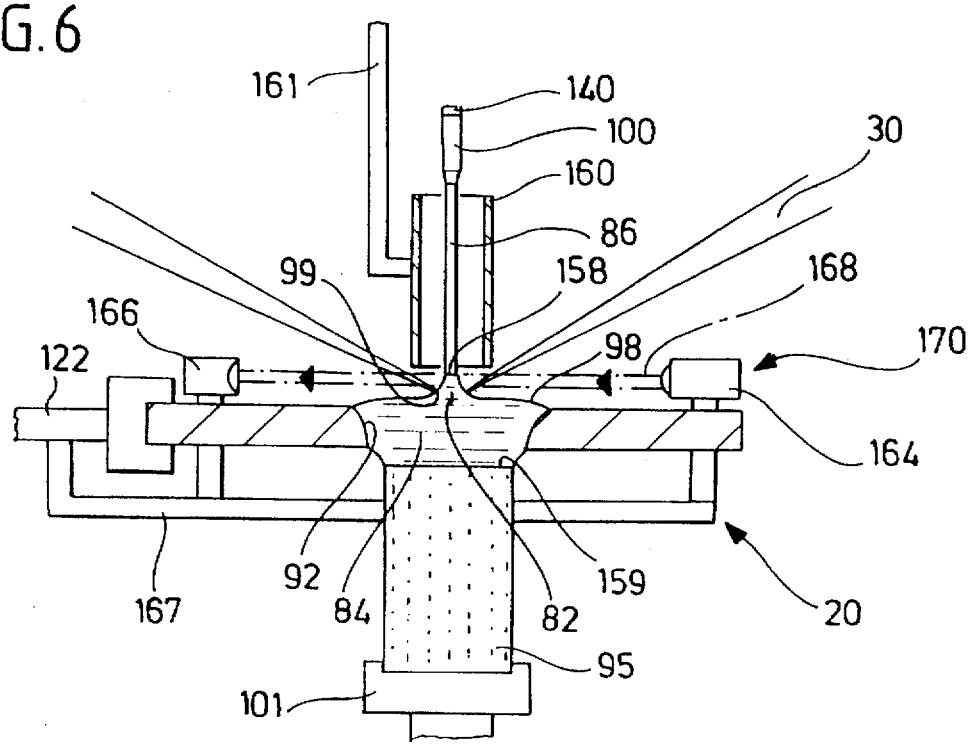
FIG. 6 shows a section from a partially cutaway side view of a fourth embodiment of an inventive apparatus for growing crystals from a molten zone with a substrate arranged above the molten zone, a subsequent heating means and an optical measuring device for determining the diameter of the deposited, crystalline material.

A fourth embodiment of an inventive apparatus 20 for growing crystals from a molten zone, a detail of which is illustrated in FIG. 6, is particularly suitable for growing crystal fibers 86.

This embodiment differs from the second embodiment illustrated in FIG. 4 in that the seed crystal 100 and the crystal (the crystal fiber) 86, on the one hand, and the rod of source material 95, on the other hand, have been interchanged with one another so that, in this case, the rod of source material 95 is clamped in the crystal holder 101, forms a lower boundary of the molten zone 84 and therefore represents a base member while the seed crystal 100 is clamped in the rod holder 140 and an underside of the crystal fiber 86 borders on the molten zone 84 from above. Accordingly, the subsequent heating means 160 is also arranged, in this embodiment, above the small plate 89, concentrically surrounding the crystal fiber 86. The holder 161 of the subsequent heating means 160 is, in this case, held by the sleeve 72 to avoid any shadowing of the convergent laser beam 30.

In order to grow a crystal fiber 86, the rod holder 140 is moved vertically upwards so that the crystal fiber 86 is moved upwards away from the molten zone 84 and source material is deposited in crystalline form at the interface 158 between the molten zone 84 and the crystal fiber 86.

The subsequent supply of source material into the molten zone 84 is effected by the crystal holder 101 being moved vertically upwards so that the rod of source material 95 is moved into the molten zone 84 and source material is melted at the interface 159 between the molten zone 84 and the rod of source material 95.

In order to control the variation of the diameter of the crystal fiber 86, the diameter of the crystal fiber 86 and/or of the upper meniscus 98 is measured in the vicinity of the interface 158 between the molten zone 84 and the crystal fiber 86 by means of an optical measuring arrangement 170 which comprises a light source 164 and a detector 166. The light source 164 and the detector 166 are arranged above the small plate 89 on oppositely located sides of the crystal fiber 86 and are held by the holding rod 122 with the aid of a holder 167.

The light source 164 generates a bundle of light 168 which is essentially parallel, propagates horizontally and intersects the crystal fiber 86 and/or the upper meniscus 98. The portion of the bundle of light 168 received by the detector 166 depends on the diameter of the crystal fiber 86 and the upper meniscus 98, respectively, due to shadowing and diffraction effects. By comparing the detector signal with a nominal value it is, therefore, possible to generate a control variable for the rotational speed of the rotary drives 113 and/or 148 (illustrated in FIG. 1) in a PID controller in order to correct the vertical speed of the rod of source material 95 or of the crystal fiber 86 in a suitable manner so that the variation in the diameter of the crystal fiber is kept as small as possible.

The diameter of the crystal fiber 86 being deposited at the time may be decreased (increased) by increasing (decreasing) the vertical speed of the crystal fiber 86.

Vice versa, the diameter of the crystal fiber 86 being deposited at the time may be increased (decreased) by increasing (decreasing) the vertical speed of the rod of source material 95.

The specified relations between the vertical speeds of the crystal fiber 86 or the rod of source material 95 and the diameter of the crystal fiber 86 are also applicable when the source material is supplied from above and the crystal fiber 86 is drawn downwards out of the molten zone 84.

Since a crystal fiber 86 deposited at a constant crystallization speed generally has a higher quality, it is particularly favorable to leave the vertical speed of the crystal fiber 86 at a constant value and merely vary the vertical speed of the rod of source material 95, for example, increase it when the measured diameter of the crystal fiber 86 is smaller than the nominal value.

A further possibility for influencing the diameter of the crystal fiber 86 at the interface 158 is to vary the laser power supplied.

If this is increased, the interface 158 between the molten zone 84 and the crystal fiber 86 migrates in vertical direction away from the focal point 82, whereby the upper meniscus 98 is constricted in the vicinity of the interface 158 and the diameter of the crystal fiber 86 at the interface 158 decreases.

If, on the other hand, the laser power supplied is reduced, the interface 158 migrates towards the focal point 82, whereby the upper meniscus 98 is constricted to a lesser extent and the diameter of the crystal fiber 86 at the interface 158 increases.

Furthermore, the diameter of the crystal fiber 86 at the interface 158 can be increased by the small plate 89 being displaced upwards relative to the focal point 82 at a constant laser power supplied from above. As already explained, the horizontal extension of the upper meniscus 98 increases thereby. Since the volume of the molten zone 84 remains essentially constant with a constant laser power, the height of the molten zone 84 decreases to compensate for this, i.e. the interface 158 between the molten zone 84 and the crystal fiber 86 and the interface 159 between the molten zone 84 and the rod of source material 95 move closer together. The upper meniscus 98 thereby broadens in the vicinity of the interface 158, and the diameter of the crystal fiber 86 at the interface 158 increases.

Vice versa, the diameter of the crystal fiber 86 at the interface 158 decreases when the small plate 89 is displaced downwards relative to the focal point at a constant laser power supplied from above.

In order to be able to measure the diameter of the crystal fiber 86 in the vicinity of the interface 158 between the molten zone 84 and the crystal fiber 86 and thus react early to changes in the diameter of the crystal fiber 86, the upper meniscus 98 of the molten zone 84 is advantageously arranged above the small plate 89, as illustrated in FIG. 6. Such a shape of the upper meniscus 98, with which an outer edge of the upper meniscus 98 is convexly curved, may be regulated by a short increase in the vertical speed of the rod of source material 95 and/or the incident laser power at the beginning of the growth process beyond its stationary average values.

Since the molten zone 84 is mechanically stabilized by the small plate 89, the rod of source material 95 and the lower meniscus 94 arranged between the small plate 89 and the rod of source material 95, the diameter of the crystal fiber 86 can be selected to be optionally smaller than the diameter of the rod of source material 95. The growth of crystal fibers 86 with a diameter of, for example, 50 μm from a rod of source material 95 having a diameter of, for example, 1 mm is therefore possible in one single growth process.

When using the conventional LHPG technique, at least one further growth process would, on the other hand, be necessary since in this process the diameter ratio between the rod of source material and the crystal fiber can be 5 at the most.

A fifth embodiment of an inventive apparatus 20 for growing crystals from a molten zone, a detail of which is illustrated in FIG. 7, is likewise particularly suitable for growing crystal fibers 86.

This embodiment differs from the fourth embodiment illustrated in FIG. 6 in that the small plate 89 does not have the same chemical composition as the source material but consists of a foreign material which has a higher melting point than the source material and is essentially not solubilized thereby.

The small plate 89 has a central, vertical, upper bore 172 and a lower bore 174 coaxial thereto, whereby the upper bore 172 has a larger diameter than the lower bore 174, the upper bore 172 opens on the upper side 153 of the small plate 89 and the lower bore 174 opens, on the one hand, on the underside 154 of the small plate 89 and, on the other hand, in the upper bore 172.

The laser power supplied is selected such that the source material located within the upper bore 172 is completely melted but the small plate 89 does not begin to melt. In this case, the interface 92 between the molten zone 84 and the small plate 89 is determined by the boundary wall of the upper bore 172 and is independent of the laser power supplied as well as the position of the focal point 82 relative to the molten zone 84.

The advantage of this embodiment is to be seen in the fact that the horizontal extension of the upper meniscus 98 is decoupled from that of the lower meniscus 94. In contrast to the relations in the embodiments of FIGS. 1 to 6, the upper meniscus 98 can therefore have an optionally larger diameter than the lower meniscus 94. Moreover, the laser power supplied need not be coordinated with the horizontal dimensions of the base member, in FIG. 7 the rod of source material 95. However, the diameter of the rod of source material 95 in comparison with the diameter of the lower bore 174 may not be selected to be too small as, otherwise, the lower meniscus 94 arranged between an upper side of the rod of source material 95 and an upper edge of the lower bore 174 is unstable.

The fifth embodiment of the inventive apparatus enables crystal fibers 86 to be drawn from the upper meniscus 98 which have a larger diameter than the rod of source material 95. A broad, upper meniscus 98 is, however, advantageous as well for the growth of crystal fibers 86 which have a smaller diameter than the rod of source material 95 since a broad, upper meniscus 98 is curved to a much lesser extent than a narrow one, which is favorable for the stability of the molten zone 84 and, therefore, the uniformness of the crystal growth.

Materials having a high melting point which are suitable for the small plate 89 are, for example, platinum, molybdenum, tungsten or sapphire.

If the molten source material does not wet the material of the small plate 89, the menisci 94, 98 form obtuse angles with the surfaces of the small plate 89, as illustrated in FIG. 7.

What is claimed is:

1. A process for growing a crystal from a molten zone, said molten zone being heated and having a source material supplied to it, said source material being melted and deposited in crystalline form on a substrate from the molten zone, characterized in that the molten zone is mechanically stabilized by an annular wall member forming a boundary of the molten zone and being essentially immovable relative to the molten zone, a base member forming a lower boundary of the molten zone and being movable relative to the wall member and a meniscus arranged between the base member and the wall member.

2. A process as defined in claim 1, characterized in that at least a part of the molten zone is arranged between oppositely located surfaces of the wall member.

3. A process as defined in claim 1, characterized in that the wall member encloses the molten zone in such a manner that an interface between the wall member and the molten zone separates an additional meniscus arranged on a side of the molten zone facing away from the base member from the meniscus arranged between the base member and the wall member.

4. A process as defined in claim 1, characterized in that a relative movement is generated between the substrate and the molten zone, the substrate hereby being moved away from the molten zone transversely to an interface between the substrate and the molten zone.

5. A process as defined in claim 1, characterized in that a relative movement is generated between the substrate and the molten zone, the substrate hereby being moved along an interface between the substrate and the molten zone.

6. A process as defined in claim 1, characterized in that the substrate is rotated about an axis aligned transversely to an interface between the substrate and the molten zone.

7. A process as defined in claim 1, characterized in that the base member is used as the substrate.

8. A process as defined in claim 1, characterized in that the material of the base member is used as source material in that a relative movement is generated between the base member and the molten zone, the base member hereby being moved into the molten zone and partially melted.

9. A process as defined in claim 8, characterized in that the substrate is arranged on a side of the molten zone located opposite to the base member.

10. A process as defined in claim 1, characterized in that the source material is introduced into the molten zone in powder form.

11. A process as defined in claim 1, characterized in that the molten zone is heated by means of laser radiation.

12. A process as defined in claim 11, characterized in that the laser radiation impinges on a side of the molten zone facing away from the base member.

13. A process as defined in claim 11, characterized in that a laser beam focused onto the molten zone with an annular cross section is generated by an optical projection means.

14. A process as defined in claim 13, characterized in that the laser beam is focused onto the molten zone free of shadows.

15. A process as defined in claim 14, characterized in that the laser beam is split in the optical projection means into at least two branch beams propagating in different directions by means of a beam splitting element splitting a cross-sectional area of the laser beam into individual, partial cross-sectional areas not overlapping one another, that the branch beams issuing from the beam splitting element are deflected onto a combining element by means of a deflecting element and that the individual branch beams are brought together again by means of the combining element.

16. A process as defined in claim 1, characterized in that a wall member having essentially the same chemical composition as the source material is used.

17. A process as defined in claim 16, characterized in that the molten zone is heated by means of a laser beam focused onto the molten zone, and that an extension of the molten zone transversely to the laser beam is adjusted by displacing the wall member relative to a focal point of the laser beam such that the size of an area within which the laser beam impinges on the molten zone or the wall member is varied.

18. A process as defined in claim 1, characterized in that a wall member consisting of a material having a higher melting point than the source material is used.

19. A process as defined in claim 18, characterized in that the molten zone is shaped by the wall member such that an additional meniscus arranged on a side of the molten zone facing away from the base member has a considerably greater extension than the meniscus arranged between the base member and the wall member.

20. A process as defined in claim 1, characterized in that an extension of the source material deposited in crystalline form along an interface between the molten zone and the substrate is measured during the growth of the crystal.

21. A process as defined in claim 1, characterized in that an extension of the molten zone along an interface between the molten zone and the substrate is measured in a region of the molten zone bordering on the substrate during the growth of the crystal.

22. A process as defined in claim 20, characterized in that the extension is measured by means of an optical measuring arrangement.

23. A process as defined in claim 22, characterized in that an intensity of a bundle of light incident in a detector is measured, said intensity being reduced due to shadowing and/or diffraction at the molten zone or the source material deposited in crystalline form.

24. A process as defined in claim 20, characterized in that the supply of source material into the molten zone is regulated as a function of the measured extension.

25. A process as defined in claim 1, characterized in that a spatially essentially constant temperature gradient is generated in the source material deposited in crystalline form.

26. A process as defined in claim 25, characterized in that the constant temperature gradient is generated by reflection of heat issuing from the source material deposited in crystalline form.

27. A process as defined in claim 25, characterized in that the constant temperature gradient is generated by heating the source material deposited in crystalline form.

28. A process as defined in claim 1 wherein crystal fibers are grown from a source material present in the form of fibers having more than five times the diameter of the crystal fibers.

29. A process for growing a crystal from a molten zone, said molten zone being heated by means of laser radiation and having a source material supplied to it, said source material being melted and deposited in crystalline form on a substrate from the molten zone, wherein the molten zone is mechanically stabilized by a wall member forming a boundary of the molten zone and being essentially immovable relative to the molten zone, a base member forming a lower boundary of the molten zone and being movable relative to the wall member and a meniscus arranged between the base member and the wall member, characterized in that the wall member encloses the molten zone in such a manner that an interface between the wall member and the molten zone separates an additional meniscus arranged on a side of the molten zone facing away from the base member from the meniscus arranged between the base member and the wall member and that a laser beam focused onto the molten zone with an annular cross section is generated by an optical projection means.

30. A process as defined in claim 29, characterized in that at least a part of the molten zone is arranged between oppositely located surfaces of the wall member.

31. A process as defined in claim 29, characterized in that a relative movement is generated between the substrate and the molten zone, the substrate hereby being moved away from the molten zone transversely to an interface between the substrate and the molten zone.

32. A process as defined in claim 31, characterized in that the relative movement between the substrate and the molten zone has three degrees of freedom.

33. A process as defined in claim 29, characterized in that a relative movement is generated between the substrate and the molten zone, the substrate hereby being moved along an interface between the substrate and the molten zone.

34. A process as defined in claim 33, characterized in that the relative movement between the substrate and the molten zone along the interface between the substrate and the molten zone has two degrees of freedom.

35. A process as defined in claim 29, characterized in that the substrate is rotated about an axis aligned transversely to an interface between the substrate and the molten zone.

36. A process as defined in claim 29, characterized in that the base member is used as the substrate.

37. A process as defined in claim 29, characterized in that the material of the base member is used as source material in that a relative movement is generated between the base member and the molten zone, the base member hereby being moved into the molten zone and partially melted.

38. A process as defined in claim 37, characterized in that the substrate is arranged on a side of the molten zone located opposite to the base member.

39. A process as defined in claim 29, characterized in that the source material is introduced into the molten zone in powder form.

40. A process as defined in claim 29, characterized in that the laser radiation impinges on a side of the molten zone facing away from the base member.

41. A process as defined in claim 29, characterized in that the laser beam is focused onto the molten zone free of shadows.

42. A process as defined in claim 41, characterized in that the laser beam is split in the optical projection means into at least two branch beams propagating in different directions by means of a beam splitting element splitting a cross-sectional area of the laser beam into individual, partial cross-sectional areas not overlapping one another, that the branch beams issuing from the beam splitting element are deflected onto a combining element by means of a deflecting element and that the individual branch beams are brought together again by means of the combining element.

43. A process as defined in claim 29, characterized in that a wall member having essentially the same chemical composition as the source material is used.

44. A process as defined in claim 43, characterized in that the molten zone is heated by means of a laser beam focused onto the molten zone, and that an extension of the molten zone transversely to the laser beam is adjusted by displacing the wall member relative to a focal point of the laser beam such that the size of an area within which the laser beam impinges on the molten zone or the wall member is varied.

45. A process as defined in claim 29, characterized in that a wall member consisting of a material having a higher melting point than the source material is used.

46. A process as defined in claim 45, characterized in that the molten zone is shaped by the wall member such that an additional meniscus arranged on a side of the molten zone facing away from the base member has a considerably greater extension than the meniscus arranged between the base member and the wall member.

47. A process as defined in claim 29, characterized in that an extension of the source material deposited in crystalline form along an interface between a molten zone and the substrate is measured during the growth of the crystal.

48. A process as defined in claim 29, characterized in that an extension of the molten zone along an interface between the molten zone and the substrate is measured in a region of the molten zone bordering on the substrate during the growth of the crystal.

49. A process as defined in claim 47, characterized in that the extension is measured by means of an optical measuring arrangement.

50. A process as defined in claim 49, characterized in that an intensity of a bundle of light incident in a detector is measured, said intensity being reduced due to shadowing and/or diffraction at the molten zone or the source material deposited in crystalline form.

51. A process as defined in claim 47, characterized in that the heating of the molten zone and the relative speed between the base member and the molten zone at the beginning of growth are coordinated with one another such that the molten zone assumes a shape enabling the interface between the molten zone and the substrate to be accessible for measuring the extension.

52. A process as defined in claim 47, characterized in that a relative speed between the substrate and the molten zone is regulated as a function of the measured extension.

53. A process as defined in claim 52, characterized in that the relative speed between the substrate and the molten zone is increased when the measured extension is greater than a nominal value, and reduced when the measured extension is smaller than the nominal value.

54. A process as defined in claim 47, characterized in that the supply of source material into the molten zone is regulated as a function of the measured extension.

55. A process as defined in claim 54, characterized in that the supply of source material into the molten zone is increased when the measured extension is smaller than a nominal value, and reduced when the measured extension is greater than the nominal value.

56. A process as defined in claim 29, characterized in that a spatially essentially constant temperature gradient is generated in the source material deposited in crystalline form.

57. A process as defined in claim 56, characterized in that the constant temperature gradient is generated by reflection of heat issuing from the source material deposited in crystalline form.

58. A process as defined in claim 56, characterized in that the constant temperature gradient is generated by heating the source material deposited in crystalline form.

59. A process as defined in claim 29, wherein crystal fibers are grown from a source material present in the form of fibers having more than five times the diameter of the crystal fibers.

* * * * *